US007322018B2

United States Patent
Rast et al.

(10) Patent No.: US 7,322,018 B2
(45) Date of Patent: Jan. 22, 2008

(54) METHOD AND APPARATUS FOR COMPUTING FEATURE DENSITY OF A CHIP LAYOUT

(75) Inventors: Keith D. Rast, Yacolt, WA (US); Zia Azam, Cary, NC (US)

(73) Assignee: Synopsys, Inc., Mountain View, CA (US)

( * ) Notice: Subject to any disclaimer, the term of this patent is extended or adjusted under 35 U.S.C. 154(b) by 213 days.

(21) Appl. No.: 11/214,959

(22) Filed: Aug. 29, 2005

(65) Prior Publication Data

US 2006/0195803 A1    Aug. 31, 2006

Related U.S. Application Data

(60) Provisional application No. 60/657,197, filed on Feb. 28, 2005.

(51) Int. Cl.
*G06F 17/50* (2006.01)
(52) U.S. Cl. .............................................. 716/5; 716/6
(58) Field of Classification Search ................ 716/4–6, 716/8
See application file for complete search history.

(56) References Cited

U.S. PATENT DOCUMENTS 6,446,239 B1 *   9/2002  Markosian et al. ............ 716/2
6,557,145 B2 *   4/2003  Boyle et al. ................... 716/2
7,093,212 B2 *   8/2006  DeCamp et al. ............... 716/4
7,155,689 B2 *  12/2006  Pierrat et al. ................. 716/4

* cited by examiner

*Primary Examiner*—Jack Chiang
*Assistant Examiner*—Binh Tat
(74) *Attorney, Agent, or Firm*—Park, Vaughan & Fleming LLP (57) ABSTRACT

One embodiment of the present invention provides a system that computes feature density for a number of areas within a layout by moving a window across the layout, which allows the system to identify areas in the layout that violate a design rule. During operation, the system receives a layout. Next, the system places the window at a first location in the layout. The system then computes the feature density value based on the features within the window at the first location. Next, the system determines a second location in the layout based on the first location and the feature density value. The system then moves the window to the second location. Next, the system computes the feature density value based on the features within the window at the second location. Note that determining the second location in the layout based on the feature density value computed at the first location instead of using a constant displacement from the first location allows the system to accurately identify an area that violates the design rule.

16 Claims, 7 Drawing Sheets

METHOD AND APPARATUS FOR COMPUTING FEATURE DENSITY OF A CHIP LAYOUT

RELATED APPLICATION

This application hereby claims priority under 35 U.S.C. §119 to U.S. Provisional Patent Application No. 60/657,197, filed on 28 Feb. 2005, entitled "Calculating Physical Layout Density without the Limits of a Fixed Step," by inventors Keith Rast and Zia Azam.

BACKGROUND

1. Field of the Invention

The present invention relates to the design and manufacturing of semiconductor chips. More specifically, the present invention relates to a method and an apparatus for computing feature density of a chip layout.

2. Related Art

The dramatic miniaturization of integrated circuits has been a key driving force behind recent technological innovations. This miniaturization has largely occurred due to rapid advances in various fabrication technologies. However, these rapid advances have been accompanied by increasingly stringent constraints (design rules) that limit the amount of allowable process variation during manufacturing.

One such design rule involves ensuring that the feature density is within a range of permissible values. Feature densities outside this range can result in peaks and valleys on the wafer's surface, which can adversely affect chip manufacturability and yield. Hence, it is very important to identify areas within a layout that violate a feature density design rule.

Present techniques for computing the feature density of a layout move a window across the layout in discrete steps, and calculate the feature density within the window at each step. This allows the technique to generate a database of window locations and their associated feature density values, which can then be used to identify areas within the layout that violate the feature density design rule.

Unfortunately, present feature density computation techniques have an inherent tradeoff between accuracy and computational time. Specifically, decreasing the step size increases the accuracy, but it also increases the computational time. On the other hand, increasing the step size reduces the computational time, but it also decreases the accuracy of detecting design rule violations.

Hence, what is needed is a method and an apparatus for computing feature density of a layout without the above-described problems.

SUMMARY

One embodiment of the present invention provides a system that computes feature density for a number of areas within a layout by moving a window across the layout, which allows the system to identify areas in the layout that violate a design rule. During operation, the system receives a layout. Next, the system places the window at a first location in the layout. The system then computes the feature density value based on the features within the window at the first location. Next, the system determines a second location in the layout based on the first location and the feature density value. The system then moves the window to the second location. Next, the system computes the feature density value based on the features within the window at the second location. Note that determining the second location in the layout based on the feature density value computed at the first location instead of using a constant displacement from the first location allows the system to accurately identify an area that violates the design rule.

In a variation on this embodiment, the system determines the second location in the layout by first receiving a design rule that specifies a density threshold. Next, the system computes a displacement using the density threshold. The system then determines the second location in the layout by adding the displacement to the first location.

In a further variation on this embodiment, the system computes the displacement using the density threshold by first computing a difference between the density threshold and the feature density value computed at the first location. The system then computes the displacement based on the difference.

In a further variation on this embodiment, the displacement is an optimal displacement, such that a displacement greater than the optimal displacement can miss violations of the design rule, and a displacement less than the optimal displacement can increase the overall computation time without improving the accuracy of identifying violations of the design rule.

In a variation on this embodiment, the system determines whether an area violates the design rule by comparing a feature density value with the density threshold. The system then flags the area if the area violates the design rule.

In a variation on this embodiment, the system subdivides the layout into multiple sections. The system then computes the feature density for a number of areas within each section. Specifically, the feature density computations within a section are performed concurrently with the feature density computations within other sections.

In a further variation on this embodiment, the system computes the displacement using the density threshold by first determining whether the area within the window at the first location violates the design rule. Note that the system can determine a design rule violation by comparing the feature density with the density threshold. Next, if the area within the window at the first location violates the design rule, the system sets the displacement to be equal to a dimension of the window, thereby improving the overall computation speed.

Another embodiment of the present invention provides a system that computes feature density for a number of areas in a layout. During operation, the system receives a layout. Next, the system computes the feature density value for a first area at a first location in the layout. The system then determines a second location in the layout based on the first location and the feature density value. Next, the system computes the feature density value for a second area at the second location in the layout.

Yet another embodiment of the present invention provides a system that computes feature density for a layout by moving a window across a section of the layout, which allows the method to identify an area in the section that violates a design rule. During operation, the system receives a layout. Next, the system computes the feature density for a first row in the section by stepping the window across the section in a first direction using a first set of variable displacements. The system then determines a lateral displacement along a second direction based on the first set of variable displacements that was used while stepping along the first row. Next, the system moves the window from the first row to a second row along the second direction based on the lateral displacement. The system then computes the feature density for the second row in the section by stepping the window across the section in the first direction using a second set of variable displacements.

In a variation on this embodiment, the lateral displacement is equal to the minimum displacement in the first set of variable displacements.

In a variation on this embodiment, if a displacement in the second set of displacements is smaller than the lateral displacement, the system computes the feature density for at least a portion of a row that is situated between the first row and the second row.

In a variation on this embodiment, the first direction and the second direction are orthogonal to each other.

DETAILED DESCRIPTION

Integrated Circuit Design Flow

Figure 1:
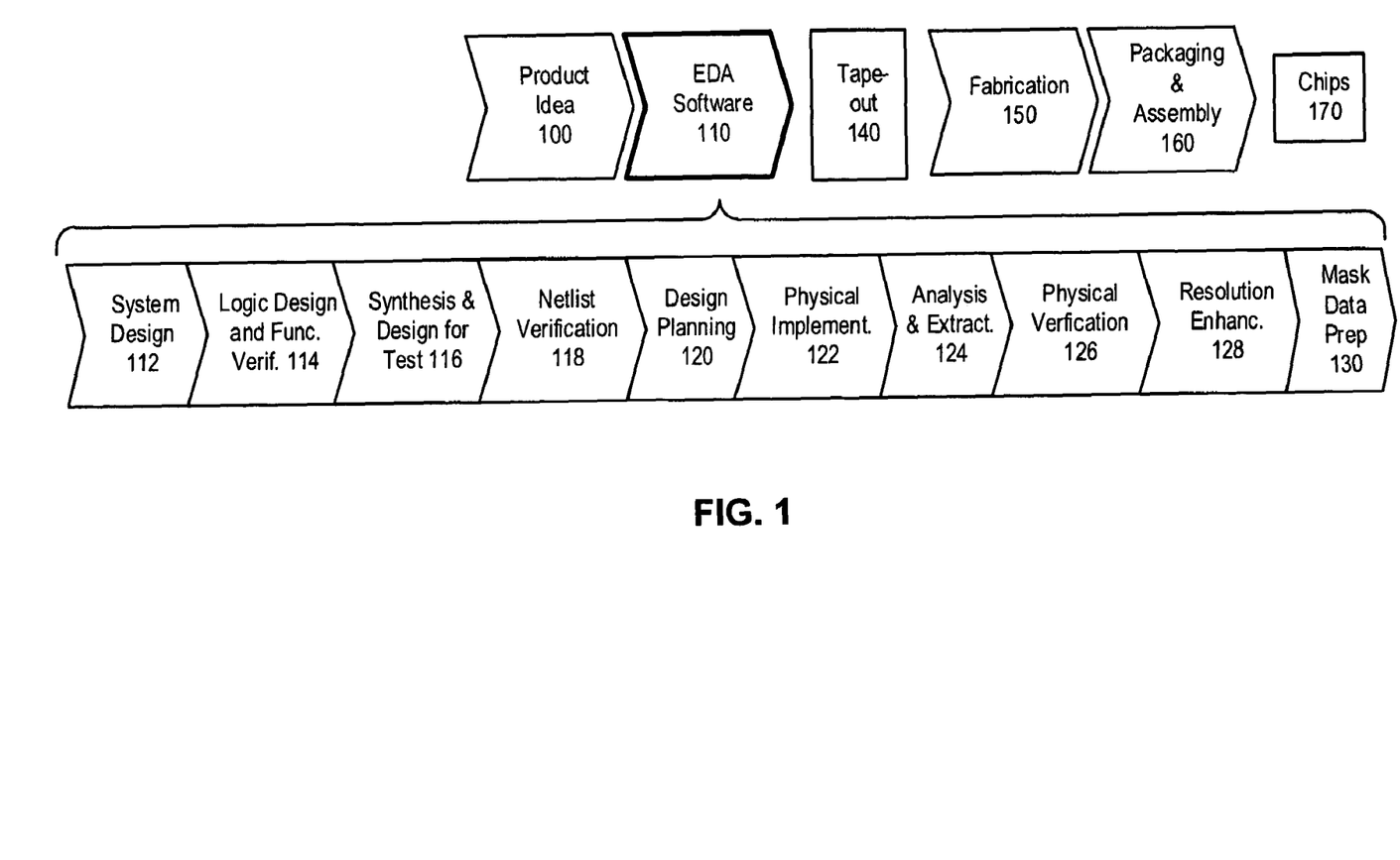
FIG. 1 illustrates an exemplary integrated circuit design flow in accordance with an embodiment of the present invention.

FIG. 1 illustrates an exemplary integrated circuit design flow in accordance with an embodiment of the present invention.

The process starts with the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. Note that the design flow description is for illustration purposes only. Specifically, this description is not meant to limit the present invention. For example, an actual integrated circuit design may require the designer to perform the design steps in a different sequence than the sequence described below. The following text provides a brief description of the steps in the design process (step 110).

System design (step 112): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level, this in turn permits what-if refinement. Exemplary EDA software products from Synopsys, Inc. that can be used at this step include Astro-Rail, PrimeRail, Primetime, and Star RC/XT products.

Physical verification (step 126): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks for lithographic use to produce finished chips. Exemplary EDA software products from Synopsys, Inc. that can be used at this step include the CATS(R) family of products.

Note that embodiments of the present invention can be used during one or more of the above described steps. Specifically, one embodiment of the present invention can be used during the physical verification step 126.

Computing Feature Density Using Smart Stepping

Figure 2:
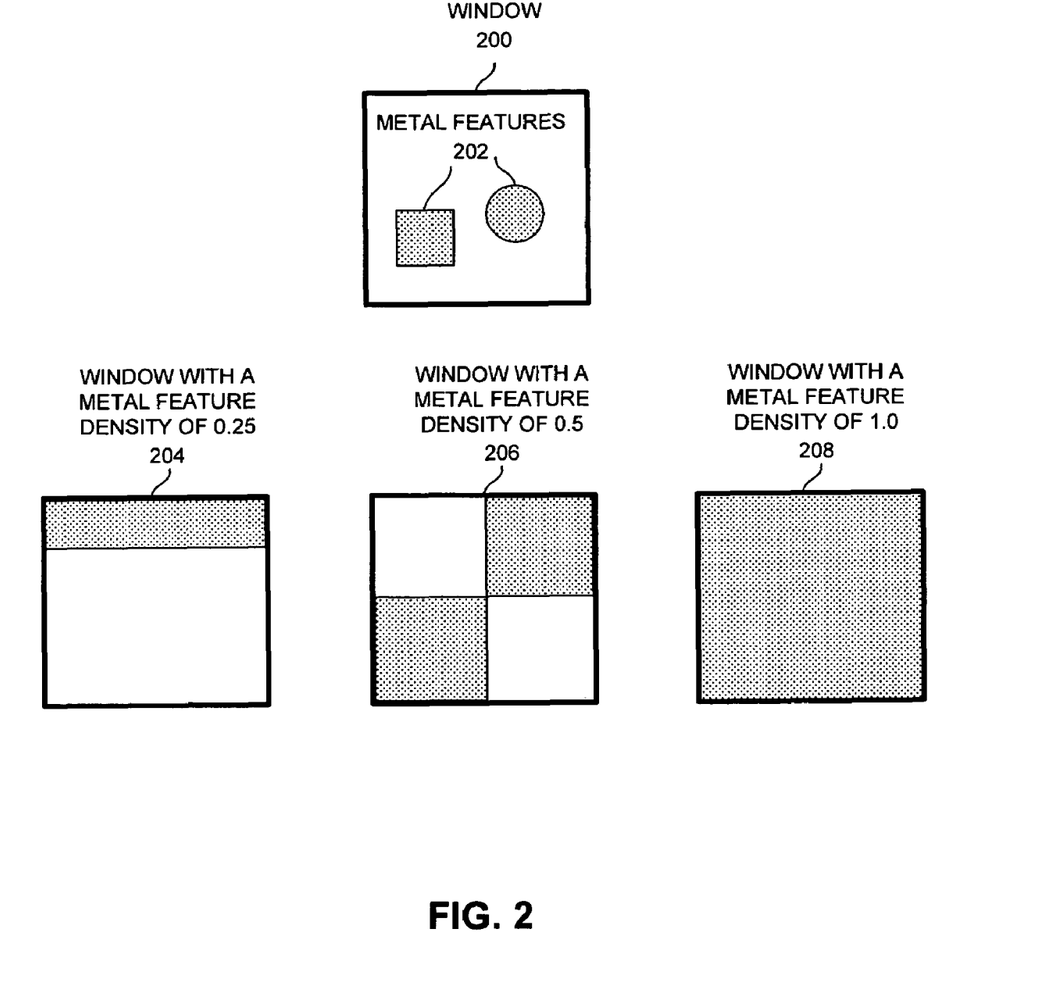
FIG. 2 illustrates exemplary feature density values in accordance with an embodiment of the present invention.

FIG. 2 illustrates exemplary feature density values in accordance with an embodiment of the present invention.

Shaded areas 202 within the window 200 represent features of a particular metal layer. Note that feature density is defined as the ratio of the total area of features within a window to the area of the window. For example, the feature density for window 200 would be equal to the ratio between the shaded area and the total area of the window.

Further, the feature densities for windows 204, 206, and 208 are 0.25, 0.5, and 1.0 respectively. Note that, because of the feature density definition used in this application, the feature density value will always be a number between 0 and 1.

Figure 3:
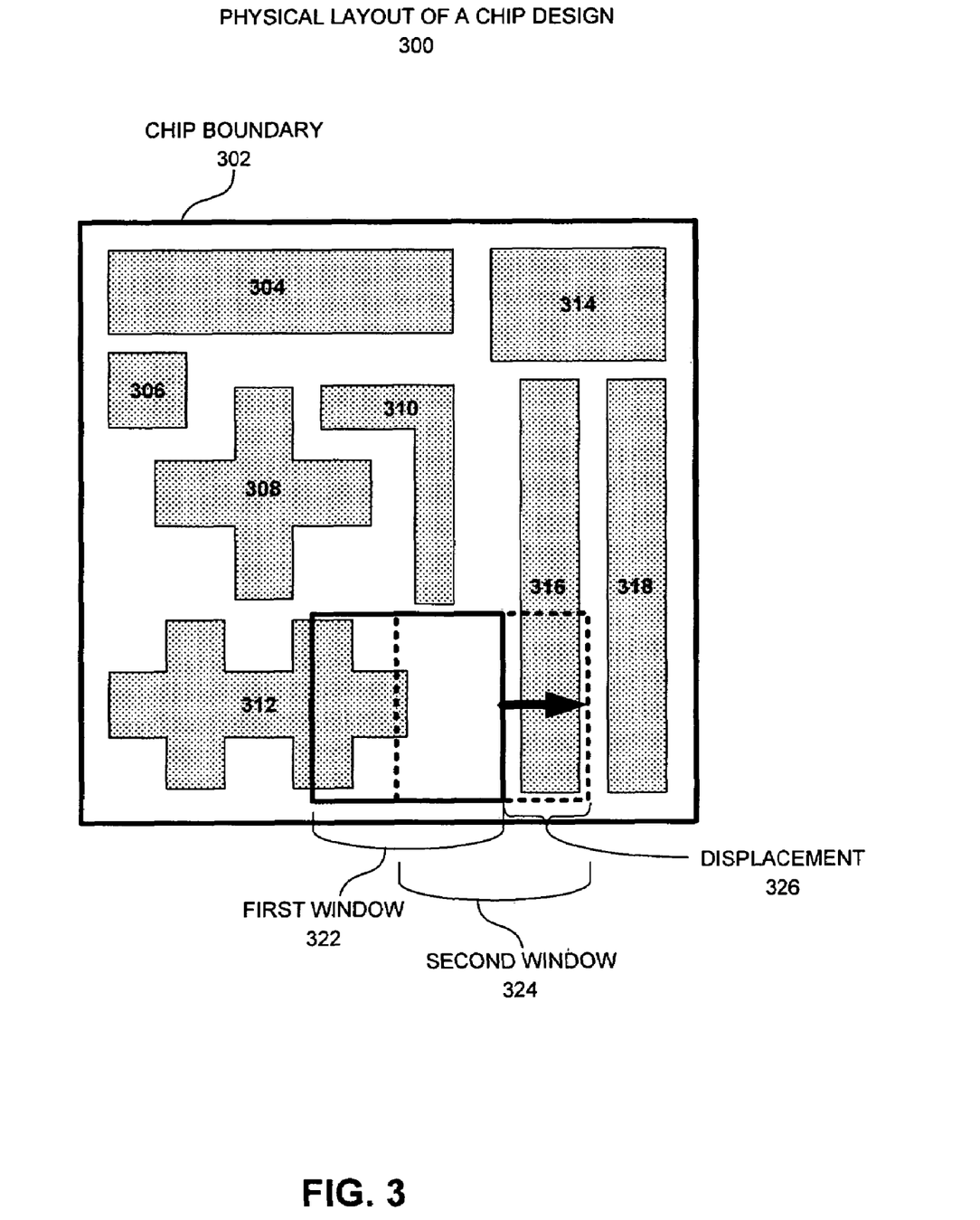
FIG. 3 illustrates an exemplary physical layout of a chip in accordance with an embodiment of the present invention.

FIG. 3 illustrates an exemplary physical layout of a chip in accordance with an embodiment of the present invention.

Layout 300 comprises a chip boundary 302 which is the outline of the layout and a number of features 304, 306, 308, 310, 312, 314, 316, and 318, which are all within the chip boundary 302. In one embodiment of the present invention, feature areas 304, 306, 308, 310, 312, 314, 316, and 318 are part of the same layer, e.g., METAL 1 layer. Note that, the different geometries and sizes of the METAL 1 regions, along with the spacing between these regions create a uniformity map of METAL 1 layer across the layout. In other words, the METAL 1 layer density varies across the layout.

A first window 322 and a second window 324 represent two consecutive steps in computing the layer density in the layout 300. The displacement 326 from the first window location to the second window location is computed based on the first window location and the feature density in the first window. Note that in present techniques, this displacement is typically a fixed value.

Figure 4:
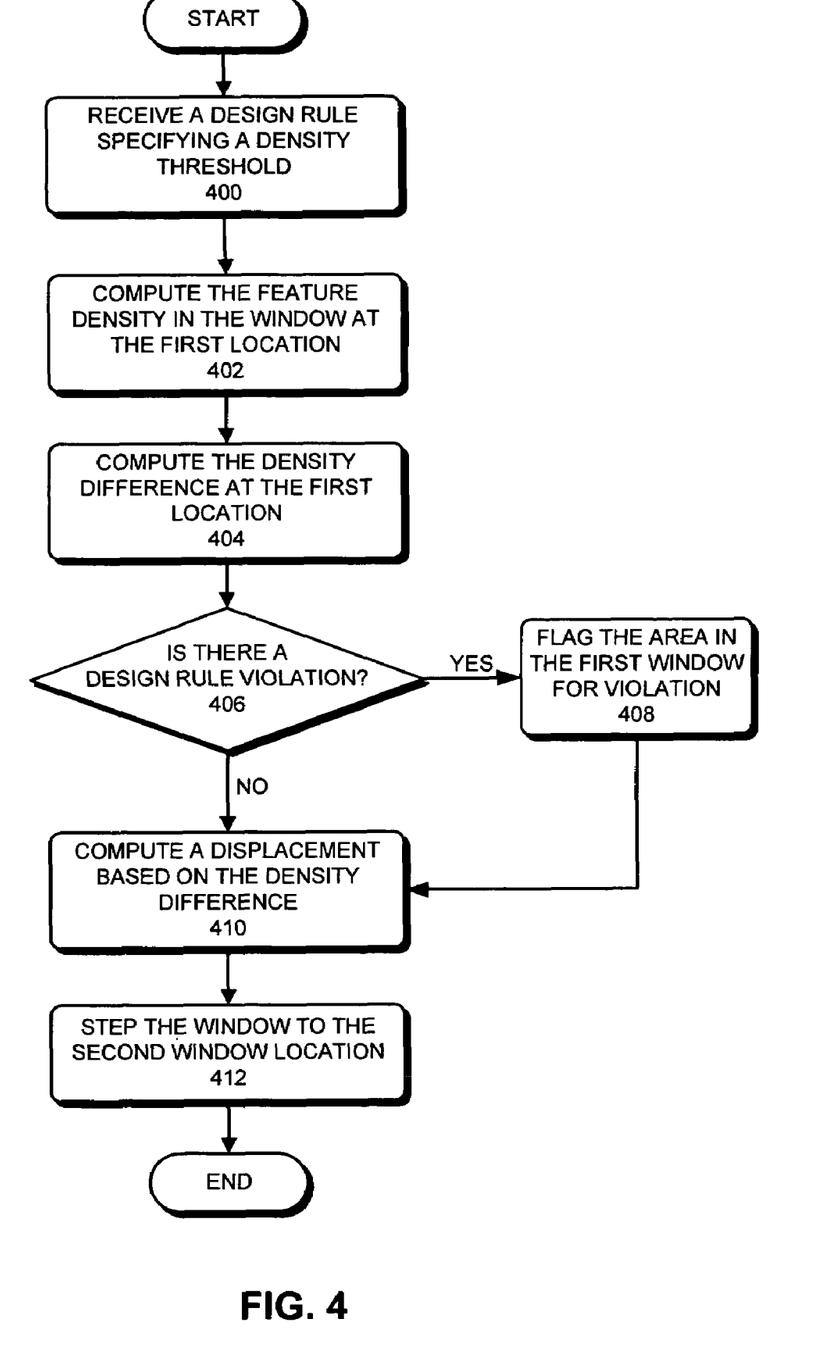
FIG. 4 presents a flowchart illustrating the process of determining the displacement from a first location to a second location in accordance with an embodiment of the present invention.

FIG. 4 presents a flowchart illustrating the process of determining the displacement from a first location to a second location in accordance with an embodiment of the present invention.

First, system receives a design rule which specifies a density threshold for the feature density value (step 400). Note that this threshold can be either an upper threshold or a lower threshold, and its value is also between [0, 1].

Next, the system computes the feature density value at the first location based on the features within the first window 322 (step 402).

Then, the system computes a difference between the density threshold and the first feature density value (step 404).

At this point, the system can also identify a violation of the design rule if the feature density value is less than a lower threshold or greater than an upper threshold (step 406). For example, if the upper threshold is 0.75, and the feature density value at the first location is 0.6, then the design rule is not violated. However, a feature density value of 0.85 will constitute a violation. Further, if the lower threshold is 0.5, and the feature density value at the first location is 0.6, then again, there is no violation. But, a density value of 0.45 will constitute a violation.

Next, if a violation is found, the area within the first window 322 is flagged (step 408). The system then computes the displacement from the first location to the second location based on the difference computed in step 404 and the first window location (step 410).

Specifically, if a design rule violation is not found in step 406, the system determines the displacement by computing an optimal value. Note that a displacement greater than the optimal value can miss violations of the design rule, whereas a displacement less than the optimal value can increase the overall computation time without improving the accuracy of identifying violations of the design rule.

The optimal displacement computation is based on identifying a worst-case scenario which can generate a violation of the design rule at the second location due to a displacement from the first location to the second location.

Figure 5A:
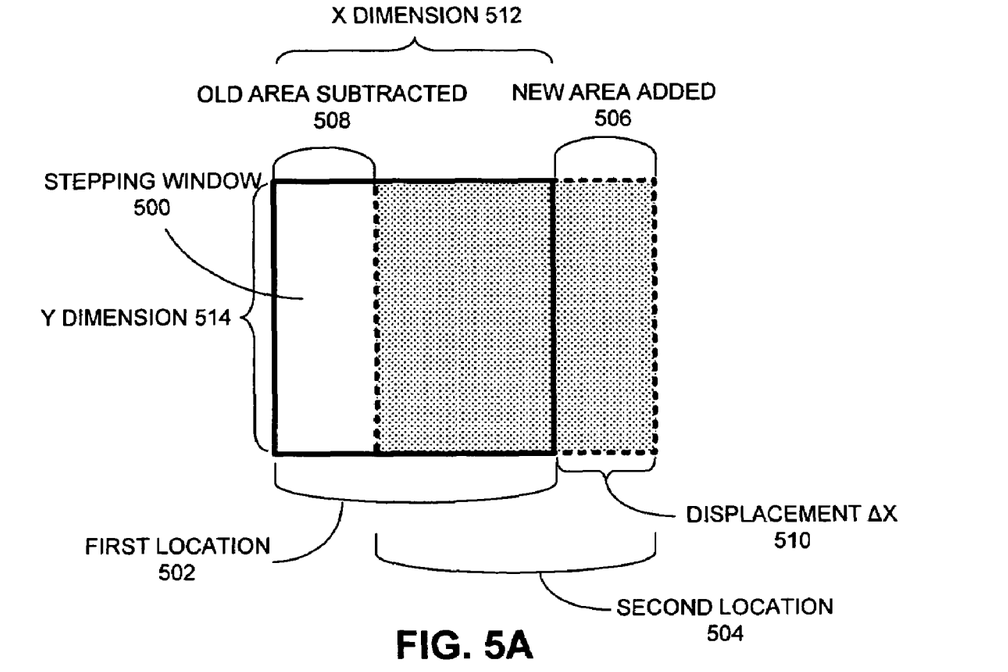
FIG. 5A illustrates how an optimal displacement can be determined in accordance with an embodiment of the present invention.

FIG. 5A illustrates how an optimal displacement can be determined in accordance with an embodiment of the present invention.

First, for an upper density threshold, the method assumes that when the stepping window 500 at the first location 502 on the left is stepped to the second location 504 on the right, the new area added 506 within the second window 504 on the right hand side is completely filled with features. This means that the new area 506 that was added to the window has a layer density of 1.0. Further, the old area 508 that was subtracted from the window does not have any features, i.e., the feature density within area 508 is 0.

Next, the method computes an optimal displacement based on this worst-case scenario. Note that if we choose the displacement to be the largest displacement allowed that will not generate a violation, then that will be the optimal displacement. This is because, a displacement greater than the optimal displacement can miss violations because we specifically chose the displacement to be the maximum displacement possible that is guaranteed not to generate a violation. For similar reasons, a displacement less than the optimal displacement is also guaranteed not to generate a violation, but it will increase the computational time for obvious reasons.

Specifically, the following derivation is used to find the optimal displacement. Let oldFeatureArea be the total area of the features in the first location 502, and let newFeatureArea be the total area of the features in the added window 504. Now, in the worst case scenario, the feature density of the added window is 1.0, which gives us:

$$\text{newFeatureArea} = \Delta X \times Y, \quad [1]$$

where Y is the height of the window (514), and $\Delta X$ is the displacement 510. Let totalWindowArea be the total area of the stepping window, which is given by:

$$\text{totalWindowArea} = X \times Y, \quad [2]$$

where X is the width of the first window (512). The feature density in the window at the second location 504 can then be calculated as:

$$\text{secondDensity} = (\text{oldFeatureArea} + \text{newFeatureArea}) / \text{totalWindowArea}, \quad [3]$$

which when simplified gives us, $$\text{secondDensity} \times \text{totalWindowArea} - \text{oldFeatureArea} = \text{newFeatureArea}. \quad [4]$$

Let firstDensity be the feature density in the stepping window at the first location 502. Then, we can express firstDensity as:

$$\text{firstDensity} = \text{oldFeatureArea} / \text{totalWindowArea}. \quad [5]$$

Substituting oldFeatureArea from [4] we get:

$$\text{secondDensity} \times \text{totalWindowArea} - \text{firstDensity} \times \text{totalWindowArea} = \text{newFeatureArea}. \quad [6]$$

Now substituting $\Delta X \times Y$ for newFeatureArea and $X \times Y$ for totalWindowArea, we get:

$$(\text{secondDensity} - \text{firstDensity}) \times X \times Y = \Delta X \times Y. \quad [7]$$

Finally, solving for ΔX, we get:

$$\Delta X = (\text{secondDensity} - \text{firstDenisty}) \times X. \quad [8]$$

Under the worst-case scenario, the secondDensity is equal to the maximum density value that does not generate a violation. This means that secondDensity should be equal to the upper density threshold $\text{Threshold}_{upper}$. Given these values one can solve for the displacement ΔX as follows:

$$\Delta X = (\text{Threshold}_{upper} - \text{firstDenisty}) \times X. \quad [9]$$

Note that, in order to avoid a violation, the optimal displacement only has to be slightly greater than the ΔX value computed above. For example, if $\text{Threshold}_{upper}=0.75$, firstDenisty=0.6, and X=100 μm, then ΔX=15 μm. In this case, the optimal displacement can be chosen to be 15 μm plus the smallest step allowed in accordance with the database resolution.

On the other hand, for a lower threshold, the worst-case scenario is when the new area 506 that is being added does not have any features while the old area 508 that is being subtracted is completely filled with features. In this case, the expression shown above computes an optimal displacement which is the largest possible displacement that does not produce a violation. Specifically, in this case, the optimal displacement is given by:

$$\Delta X = (\text{firstDenisty} - \text{Threshold}_{lower}) \times X, \quad [10]$$

where $\text{Threshold}_{lower}$ is the lower density threshold. Again, in order to avoid a violation, the optimal displacement only has to be slightly less than the ΔX value computed above. For example, if $\text{Threshold}_{upper}=0.45$, currentDenisty=0.6, and X=100 μm, then ΔX=15 μm. In this case, the optimal displacement can be chosen to be 15 μm minus the smallest step allowed in accordance with the database resolution.

In both cases described above, the optimal displacement is proportional to the density difference in the first location 502 and the X dimension (512) of the stepping window 500. Further, when both thresholds are specified, the optimal displacement is the smaller of the two optimal displacements computed that were computed above, i.e., $$\text{Displacement} = \min(\text{Displacement}_{upper}, \text{Displacement}_{lower}), \quad [11]$$

where $\text{Displacement}_{upper}$ is the optimal displacement found using the upper density threshold, and $\text{Displacement}_{lower}$ is the optimal displacement found using the lower density threshold.

Once the optimal displacement is determined, the stepping window 500 is stepped from the first location 502 to the second location 504 by this amount (step 412).

Next the feature density value within the window at the second location 504 can be computed and this process can continue as the window 500 moves to a third location and so on.

Allowing the system to compute the window displacement based on the feature density at the current window location and the threshold values, enables the system to compute the feature densities accurately and efficiently. Specifically, the system can make small steps in areas closer to the threshold value and make larger steps in the areas further away. By doing this, the system can intelligently look at the feature densities and determines the best step to take.

Additionally, the system can receive a user-specified minimum displacement value. This puts a lower bound on the smallest step, i.e., the step size cannot be reduced beyond this lower bound. This prevents the system from spending unnecessary time calculating down to the database resolution.

Referring back to step 406 in FIG. 4, if a violation of the design rule is identified in this step, the system can improve the speed of window stepping process using the approach described below.

Figure 5B:
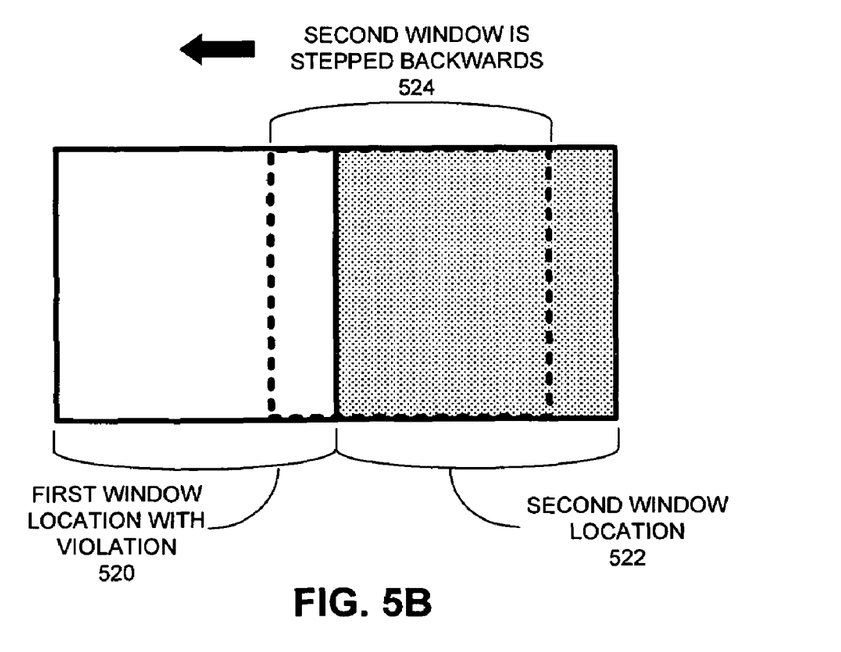
FIG. 5B illustrates how a window can be stepped when a design rule violation is found in accordance with an embodiment of the present invention.

FIG. 5B illustrates how a window can be stepped when a design rule violation is found in accordance with an embodiment of the present invention.

First, the system sets the displacement to the full width of the first window location 520 to obtain the second window location 522. As a result, the second window location 522 is directly adjacent to the first window location. Next, the system computes a feature density for the second window location 522. If a violation is not found in the second window location 522, the window is stepped backwards until a violation is found (step 524). What this procedure accomplishes is that if the second window location 522 is a violation, then any computation described in FIG. 4 in between window locations 520 and 522 is not necessary due to the fact that the combined area of 520 and 522 is still a violation. On the other hand, if window 522 is not a violation, the procedure only has to back track as far as the next violation is found. Because of these reasons the approach can improve the overall computation speed.

Figure 6:
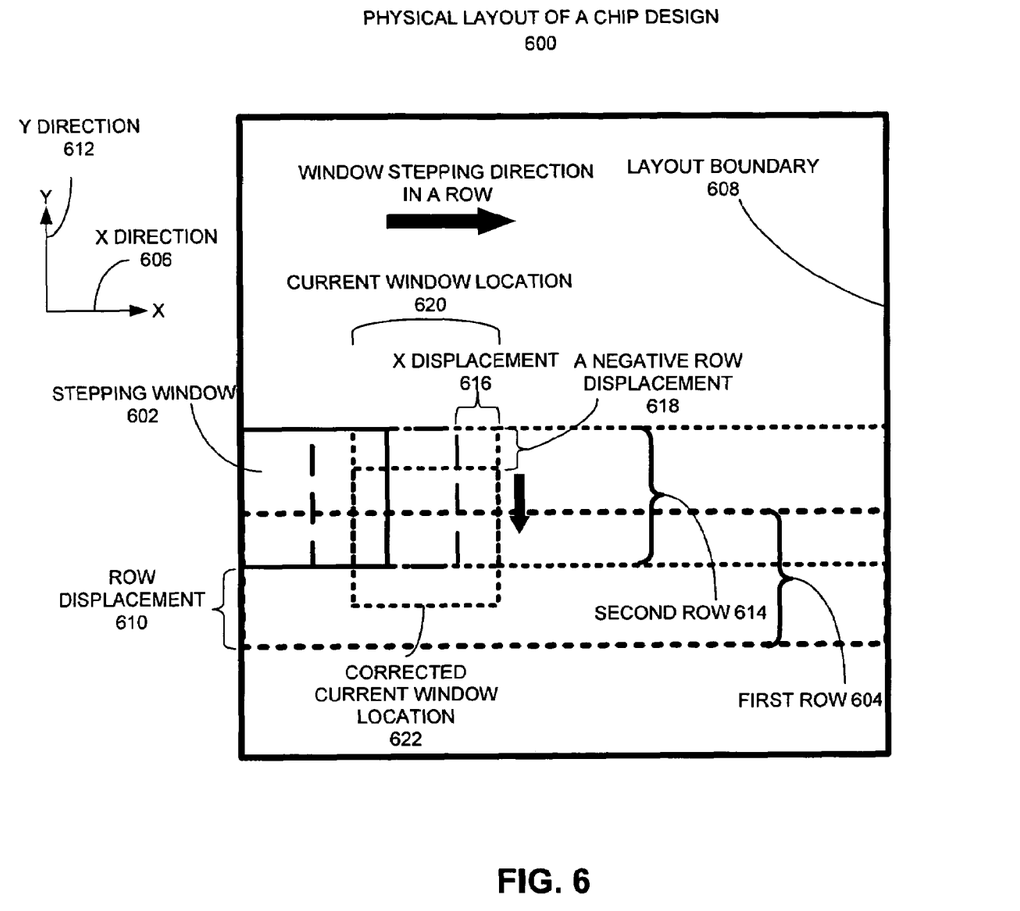
FIG. 6 illustrates how the feature density for a layout can be computed one row at a time in accordance with an embodiment of the present invention.

FIG. 6 illustrates how the feature density for a layout 600 can be computed one row at a time in accordance with an embodiment of the present invention.

A stepping window 602 steps from left to right along a first row 604 in the X-direction 606 in the same manner as described in FIG. 3 and FIG. 4, until the layout boundary 608 is reached by the stepping window. At that point the stepping window 602 is pulled back so that the edge of the window ends on the layout boundary 608. Next, the smallest displacement in the set of the displacements computed during the first row 604 is used as a row displacement 610 in the Y-direction 612. The stepping window 602 then moves to a second row 614 and begins stepping from left to right in the second row 614. This process continues row by row until the entire layout is covered.

During stepping in the second row 614, the X displacement 616 may become smaller than the row displacement 610 which is the smallest X displacement in the first row. This happens when a feature density value in the second row 614 is very close to the density threshold value, while none of the feature density values computed in the first row 604 is as close. In these circumstances, the stepping window 602 needs to be stepped in the negative Y direction to check for possible missed violations. A negative row displacement 618 is then taken from the current stepping window location 620 to get a corrected current window location 622. Doing this can catch possible violations that may have been missed because of a larger row displacement 610.

Using Multiple Threads to Improve Performance

The system can use multiple threads to improve the performance of the feature density computation in a layout. Specifically, instead of using a single stepping window to step through the entire layout, the layout is subdivided into multiple sections. The system then computes the feature density in each of the multiple sections of the layout concurrently using multithreading or multiprocessing techniques. In other words, each section is assigned a stepping window that steps through its designated section independent of other stepping windows in the other sections.

Figure 7:
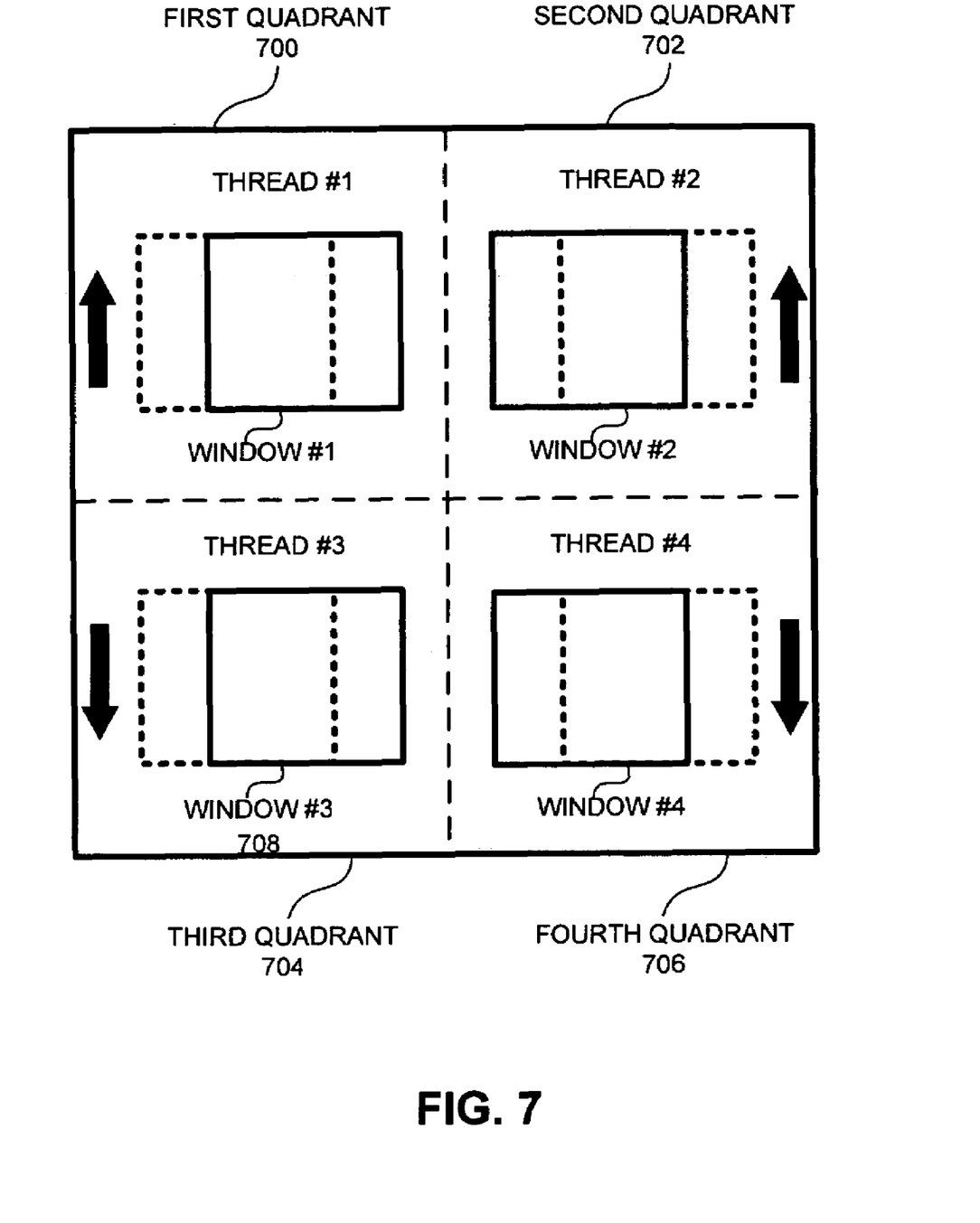
FIG. 7 illustrates how the feature density for a layout can be computed by subdividing the layout into multiple sections in accordance with an embodiment of the present invention.

In one embodiment, the system divides the layout into four quadrants 700, 702, 704, and 706, and uses one, two, or four threads to process these quadrants. (Note that the following description uses one/two/four quadrants/threads for illustration purposes only. It will be apparent to one skilled in the art that a larger or smaller number of quadrants/threads can also be used for improving performance of the feature density computation.)

FIG. 7 illustrates how the feature density for a layout can be computed by subdividing the layout into multiple sections in accordance with an embodiment of the present invention.

For each of the four quadrants, a stepping window is used only within the designated quadrant. For example, thread #3 operates on window #3 (708) within the third quadrant 704.

The following description provides details for embodiments that use 1, 2, and 4 threads. Note that if we have one thread, it will work in all four quadrants.

If we have one thread:
Start from the center.
Thread 1 left, thread 1 right, when finished store the minimum X step, move up one row, continue until the top is reached. Retrieve first minimum X step, then process down:
  thread 1 left, thread 1 right, when finished then move down one row, continue until the bottom is reached.

If we have two threads, one will work on the left half, the other on the right half:
Start from the center.
Thread 1 left, thread 2 right, when finished store the minimum X step, move up one row, continue until the top is reached. Retrieve first minimum X step, then process down:
  thread 1 left, thread 2 right, when finished then move down one row, continue until the bottom is reached.

If we have four threads, two will work upwards, the other two downwards:
Start from center.
Thread 1 left, thread 2 right, when finished use the minimum X step to spawn threads 3 and 4. Continue thread 1 and 2 for each row up until the top is reached.
At the same time threads 3 and 4 will be working down:
  thread 3 left, thread 4 right, when finished then move down one row, continue until the bottom is reached.

The displacement computation for the window stepping is the same in all three cases as described above. It will be apparent that the multithreading technique described above can also be used in cases when the number of quadrants/threads is different from those used in the above description.

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs).

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent. Additionally, the above disclosure is not intended to limit the present invention. The scope of the present invention is defined by the appended claims.

What is claimed is:

1. A method for computing feature density for a number of areas within a layout by moving a window across the layout, which allows the method to identify an area in the layout that violates a design rule, the method comprising:
receiving a layout;
placing the window at a first location in the layout;
computing a first feature density value based on the features within the window at the first location;
determining a second location in the layout as a function of the first location and the first feature density value;
moving the window to the second location;
computing a second feature density value based on the features within the window at the second location;
wherein determining the second location in the layout based on the first feature density value instead of using a constant displacement from the first location allows the method to accurately identify an area that violates the design rule determining whether an area violates the design rule by comparing a feature density value with the density threshold; and
flagging the area if the area violates the design rule.

2. The method of claim 1, wherein determining the second location in the layout involves:
receiving a design rule that specifies a density threshold;
computing a displacement using the density threshold; and
determining the second location in the layout by adding the displacement to the first location.

3. The method of claim 2, wherein computing the displacement using the density threshold involves:
computing a difference between the density threshold and the first feature density value; and
computing the displacement based on the difference.

4. The method of claim 2, wherein the displacement is an optimal displacement;
wherein a displacement greater than the optimal displacement can miss violations of the design rule;
wherein a displacement less than the optimal displacement can increase the overall computation time without improving the accuracy of identifying violations of the design rule.

5. The method of claim 2, wherein computing the displacement using the density threshold further involves:
determining whether the area within the window at the first location violates the design rule by comparing the first feature density with the density threshold; and
if the area within the window at the first location violates the design rule, setting the displacement to be equal to a dimension of the window, thereby improving the overall computation speed.

6. The method of claim 1, wherein the method further comprises:
subdividing the layout into multiple sections; and
computing the feature density for a number of areas within each section, wherein the feature density computations within a section are performed concurrently with the feature density computations within other sections.

7. A computer-readable storage medium storing instructions that when executed by a computer cause the computer to perform a method for computing feature density for a number of areas within a layout by moving a window across the layout, which allows the method to identify an area in the layout that violates a design rule, the method comprising:

receiving a layout;

placing the window at a first location in the layout;

computing a first feature density value based on the features within the window at the first location;

determining a second location in the layout as a function of the first location and the first feature density value;

moving the window to the second location;

computing a second feature density value based on the features within the window at the second location;

wherein determining the second location in the layout based on the first feature density value instead of using a constant displacement from the first location allows the method to accurately identify an area that violates the design rule determining whether an area violates the design rule by comparing a feature density value with the density threshold; and flagging the area if the area violates the design rule.

8. The computer-readable storage medium of claim 7, wherein determining the second location in the layout involves:

receiving a design rule that specifies a density threshold;

computing a displacement using the density threshold; and determining the second location in the layout by adding the displacement to the first location.

9. The computer-readable storage medium of claim 8, wherein computing the displacement using the density threshold involves:

computing a difference between the density threshold and the first feature density value; and computing the displacement based on the difference.

10. The computer-readable storage medium of claim 8, wherein the displacement is an optimal displacement;

wherein a displacement greater than the optimal displacement can miss violations of the design rule;

wherein a displacement less than the optimal displacement can increase the overall computation time without improving the accuracy of identifying violations of the design rule.

11. The computer-readable storage medium of claim 8, wherein computing the displacement using the density threshold further involves:

determining whether the area within the window at the first location violates the design rule by comparing the first feature density with the density threshold; and if the area within the window at the first location violates the design rule, setting the displacement to be equal to a dimension of the window, thereby improving the overall computation speed.

12. The computer-readable storage medium of claim 7, wherein the method further comprises:

subdividing the layout into multiple sections; and computing the feature density for a number of areas within each section, wherein the feature density computations within a section are performed concurrently with the feature density computations within other sections.

13. A computer-readable storage medium storing instructions that when executed by a computer cause the computer to perform a method for computing feature density for a layout by moving a window across a section of the layout, wherein computing the feature density allows the method to identify an area in the section that violates a design rule, the method comprising:

receiving a layout;

computing the feature density for a first row in a section of the layout by stepping the window across the section in a first direction using a first set of variable displacements;

determining a lateral displacement along a second direction based on the first set of variable displacements;

moving the window from the first row to a second row along the second direction based on the lateral displacement;

computing the feature density for the second row in the section by stepping the window across the section in the first direction using a second set of variable displacements determining whether an area violates the design rule by comparing a feature density with the density threshold; and flagging the area if the area violates the design rule.

14. The computer-readable storage medium of claim 13, wherein the lateral displacement is equal to the minimum displacement in the first set of variable displacements.

15. The computer-readable storage medium of claim 13, wherein if a displacement in the second set of displacements is smaller than the lateral displacement, the method computes the feature density for at least a portion of a row that is situated between the first row and the second row.

16. The computer-readable storage medium of claim 13, wherein the first direction and the second direction are orthogonal to each other.

* * * * *